United States Patent [19]
Lan

[11] Patent Number: 6,153,528
[45] Date of Patent: Nov. 28, 2000

[54] METHOD OF FABRICATING A DUAL DAMASCENE STRUCTURE

[75] Inventor: Shih-Ming Lan, Hsinchu, Taiwan

[73] Assignee: United Silicon Incorporated, Hsinchu, Taiwan

[21] Appl. No.: 09/205,912

[22] Filed: Dec. 4, 1998

[30] Foreign Application Priority Data

Oct. 14, 1998 [TW] Taiwan ............................. 87117029

[51] Int. Cl.$^7$ ............................................. H01L 21/302
[52] U.S. Cl. .................. 438/697; 438/754; 438/687; 438/691; 438/723; 438/724
[58] Field of Search ................... 438/687, 691, 438/697, 699, 723, 724, 756, 757, 754

[56] References Cited

U.S. PATENT DOCUMENTS

| | | | |
|---|---|---|---|
| 5,472,913 | 12/1995 | Havemann et al. | 437/195 |
| 5,849,367 | 12/1998 | Dixit et al. | 427/535 |
| 5,891,804 | 4/1999 | Havemann et al. | 438/674 |
| 5,950,102 | 9/1999 | Lee | 438/619 |
| 5,985,762 | 11/1999 | Geffken et al. | 438/687 |
| 5,989,623 | 11/1999 | Chen | 427/97 |
| 6,008,540 | 12/1999 | Lu et al. | 257/758 |

Primary Examiner—William Powell
Assistant Examiner—George Goudreau
Attorney, Agent, or Firm—J. C. Patents; Jiawei Huang

[57] ABSTRACT

A method for fabricating a dual damascene structure is provided. The method contains providing a substrate, which has a patterned metal layer on it. A first liner oxide layer, a first seed layer are sequentially formed over the substrate. The first seed layer is patterned to form a first opening above the patterned metal layer to expose the first liner oxide layer. A first dielectric layer is formed over the substrate. The first dielectric layer includes a first porous dielectric layer on the first seed layer, and a first normal dielectric layer on the exposed portion of the first liner oxide layer. A first cap layer is formed over the first dielectric layer, and is planarized. An etching stop layer with a second opening above the first opening to expose the first cap layer is formed on the first cap layer. With the same formation mechanism, a second liner oxide layer, a second seed layer with a third opening above the second opening, a second porous dielectric layer, a second cap layer are formed over the substrate. A mask layer is formed over the second cap layer. Patterning the above layers forms a damascene opening in the first normal dielectric layer and the second normal dielectric layer. Filling the dual damascene opening with metallic material forms a dual damascene structure.

20 Claims, 6 Drawing Sheets

METHOD OF FABRICATING A DUAL DAMASCENE STRUCTURE

CROSS-REFERENCE TO RELATED APPLICATION

This application claims the priority benefit of Taiwan application Ser. No. 87117029, filed Oct. 14, 1998, the full disclosure of which is incorporated herein by reference.

BACKGROUND OF THE INVENTION

1. Field of the Invention

The invention relates to semiconductor fabrication, and more particularly to a method for fabricating a dual damascene structure.

2. Description of Related Art

A conventional method for fabricating a dual damascene structure typically includes simultaneously forming a via plug and a metal line in a dielectric layer. In more detail, a planarized dielectric layer is formed on a substrate, usually having a metal layer on top. According to a design, patterning the dielectric layer forms a via opening and a trench, in which the via opening exposes the metal layer below the dielectric layer, and the trench with wider width is formed over the via opening. A metal material is filled in the via opening and the trench so that a via plug filling the via opening and a metal line filling the trench are simultaneously formed. The via plug serves as a vertical coupling between two interconnecting metal layers, and the metal line, extending horizontally, is the upper interconnecting metal layer, which is electrically coupled to the lower interconnecting metal layer below the dielectric layer through the via plug. The formation of the via plug and the metal line further includes forming a metal layer over the substrate to fill the via opening and the trench and planarizing the metal layer to remove a portion of the metal layer other than the trench.

FIGS. 1A–1E are cross-sectional views of a portion of a substrate, schematically illustrating a convention fabrication process for forming a dual damascene structure.

Figure 1A:
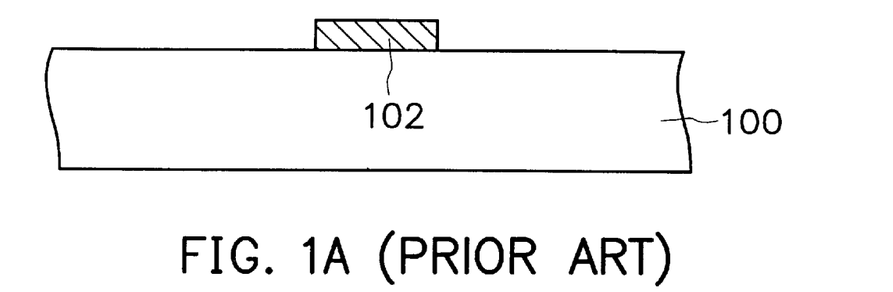
FIGS. 1A–1E are cross-sectional views of a portion of a substrate, schematically illustrating a convention fabrication process for forming a dual damascene structure.

FIG. 1A, a patterned metal layer 102 is formed on a substrate 100, which includes formed devices (not shown). The formation of the patterned metal layer 102 includes performing a chemical vapor deposition (CVD) process or a physical vapor deposition (PVD) process to deposit a metal layer, and patterning the metal layer to form the patterned metal layer 102.

Figure 1B:
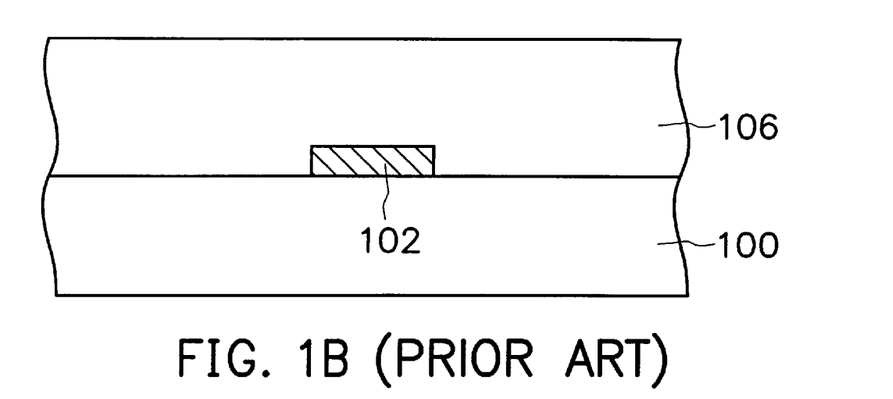

In FIG. 1B, a dielectric layer 106 is formed over the substrate 100. The dielectric layer 106 including silicon oxide has a typical dielectric constant of 4–4.9. A planarization process is performed to planarize the dielectric layer and to obtain a desired thickness.

Figure 1C:
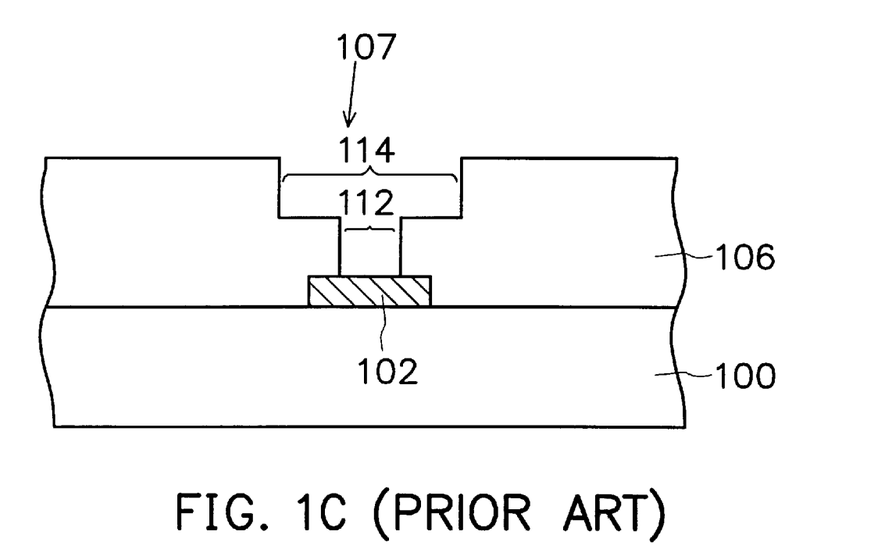

In FIG. 1C, the dielectric layer 106 is patterned so as to form a dual damascene opening 107 in the dielectric layer 106 and expose the metal layer 102. The dual damascene opening 107 has a via opening 112 to expose the metal layer 102 and a trench 114 over the via opening so that the via opening 112 is exposed by the trench 114. The via opening 112 extends vertically but the trench 114 extends horizontally.

Figure 1D:
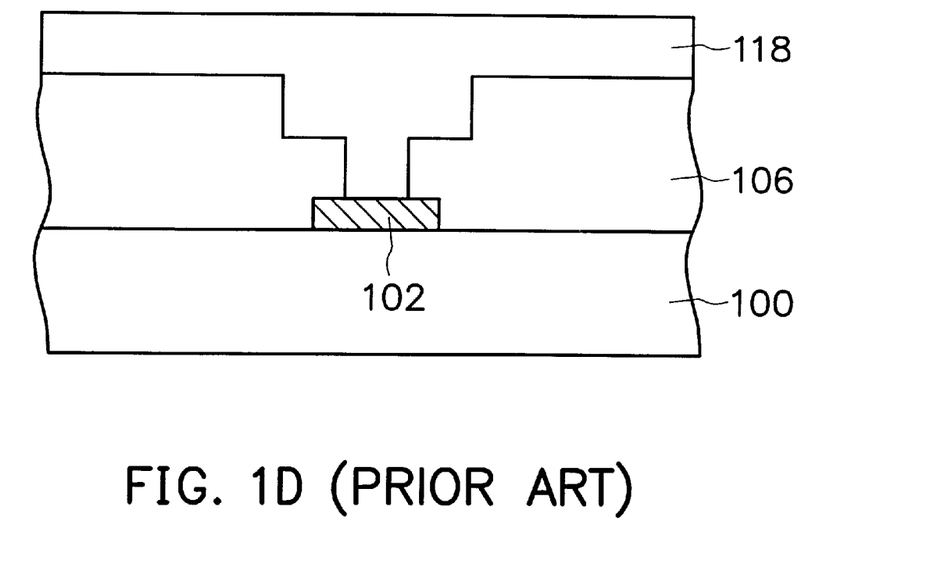
Figure 1E:
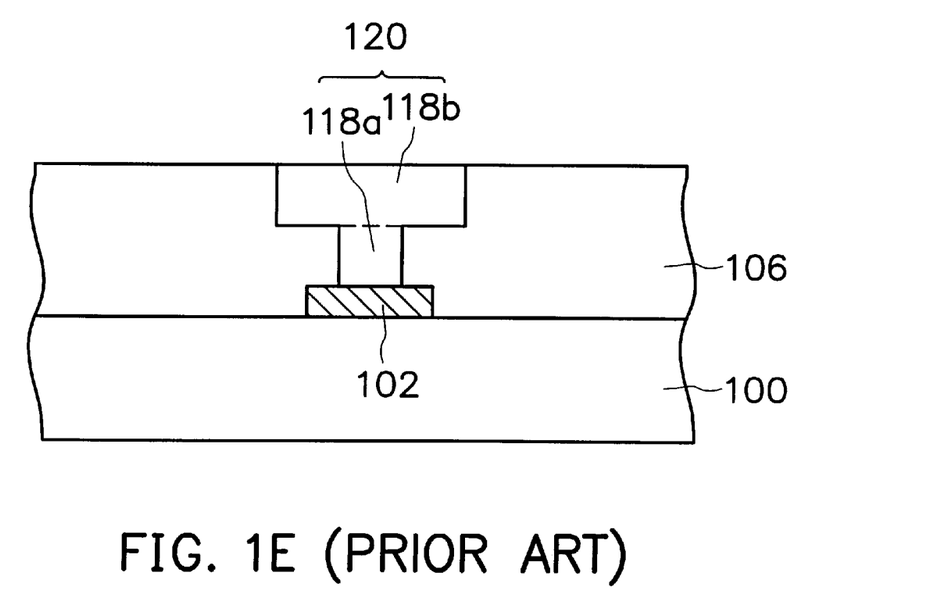

In FIG. 1D, a metal layer 118 is formed over the substrate 100 so that the via opening 112 and trench 114 of FIG. 1C, are also filled. In FIG. a chemical mechanical polishing (CMP) process is performed to remove a portion of the metal layer 118 other than the trench 114. So, the dielectric layer 106 is exposed. A remaining portion of the metal layer 118 simultaneously filling the via opening 112 and the trench 114 of FIG. 1C becomes a damascene metal line 120 including a via plug 118a and a metal line 118b. The via plug 118a fills the via opening 112 of FIG. 1C, and the metal line 118b fills the trench 114 of FIG. 1C. The metal line 118b is electrically coupled to the metal layer 102 through via plug 118a. A conventional dual damascene structure is formed.

In the conventional dual damascene structure, the dielectric layer 106 has the dielectric constant of 4–4.9, which is a typical quantity and is not small. When a device is fabricated in a highly reduced dimension, a line pitch between each the damascene metal line 120 is greatly reduce. The dielectric layer exits between each the damascene metal line 120 so that a parasitic capacitor is severely formed between each the damascene metal line 120. The parasitic capacitor causes a resistance-capacitance (RC) time delay. In addition, a cross talk phenomenon between the adjacent damascene metal line 120 also occurs. A device performance therefore is greatly degraded.

SUMMARY OF THE INVENTION

It is therefore an object of the present invention to provide a method for fabricating a dual damascene metal line with a smaller dielectric constant so as to reduce a parasitic capacitor effect and a cross-talk phenomenon. A device therefore can have faster operation speed and a device performance is effectively improved.

In accordance with the foregoing and other objectives of the present invention, a method for fabricating a dual damascene metal line with a smaller dielectric constant is provided. The invention includes providing a substrate having a formed device and a patterned metal layer. A conformal first liner oxide layer, a conformal first seed layer are sequentially formed over the substrate. The first seed layer is patterned to form a first opening above the patterned metal layer. The first opening exposes the first liner oxide layer at a portion above the patterned metal layer. A first dielectric layer is formed over the substrate. The first dielectric layer includes a first porous dielectric layer on the first seed layer, and a first normal dielectric layer on the exposed portion of the first liner oxide layer. A first cap layer is formed over the first dielectric layer, and is planarized. An etching stop layer with a second opening above the first opening to expose the first cap layer is formed on the first cap layer. A conformal second liner oxide layer is formed over the substrate. A conformal second seed layer is formed on second liner oxide layer with a third opening to expose the second liner oxide layer. The third opening is above the second opening with a greater width.

A second dielectric layer is formed over the substrate. The second dielectric layer includes a second porous dielectric layer on the second seed layer, and a second normal dielectric layer on the exposed portion of the second liner oxide layer. A second cap layer is formed over the second dielectric layer, and is planarized. A mask layer is formed over the second cap layer.

Using the etching stop layer as an etching stop point, a trench is formed by patterning the mask layer, the second cap layer, the second normal dielectric layer and the second seed layer so that a trench is formed to expose the second opening and the etching stop layer. The etching stop layer further serves as a mask, the patterning process is continuously performed to remove the materials exposed by the second opening until the patterned metal layer is exposed. A via opening is formed beneath the trench with a narrower width. The trench and the via opening form together as a dual damascene opening. A conductive layer is formed over the substrate to fill the dual damascene opening, and using the mask layer as a planarization stop point, the conductive layer is planarized to form a dual damascene structure.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 2A:
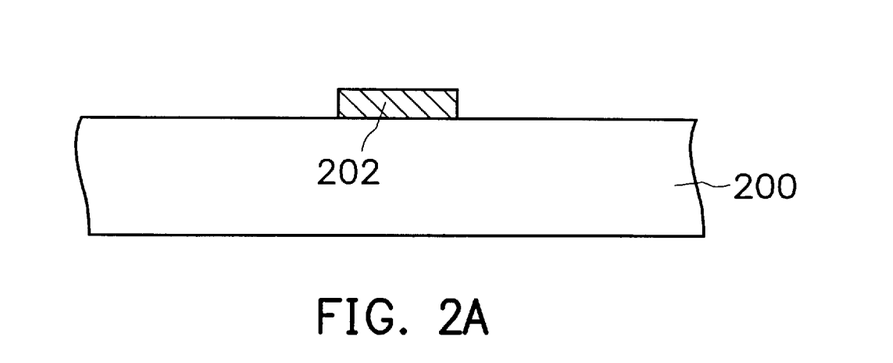
FIGS. 2A–2H are cross-sectional views of a portion of a substrate, schematically illustrating a fabrication process for forming a dual damascene structure, according to a preferred embodiment of the invention.

FIGS. 2A–2H are cross-sectional views of a portion of a substrate, schematically illustrating a fabrication process for forming a dual damascene structure, according to a preferred embodiment of the invention. In FIG. 2A, a patterned metal layer 202 is formed on a substrate 200, which includes formed devices (not shown). The formation of the patterned metal layer 202 includes performing a chemical vapor deposition (CVD) process or a physical vapor deposition (PVD) process to deposit a metal layer, and patterning the metal layer to form the patterned metal layer 202. The patterned metal layer 202 usually is also called an interconnecting metal layer.

Figure 2B:
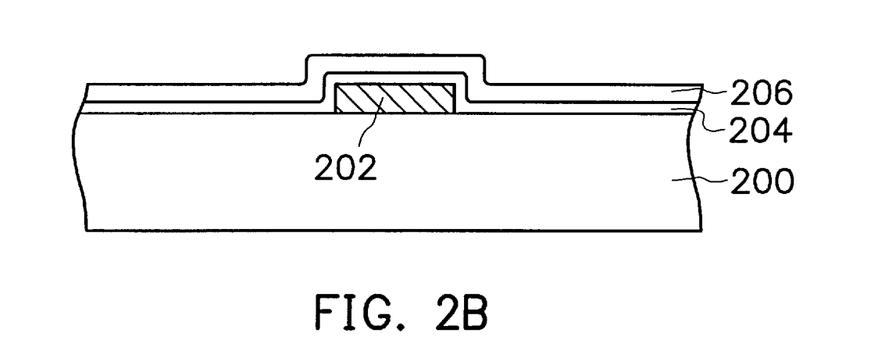

In FIG. 2B, a conformal liner oxide layer 204 and a seed layer 206 are sequentially formed over the substrate 200. The liner oxide layer 204 including, for example silicon oxide, is preferably formed by CVD. The seed layer 206 includes, for example, silicon-oxygen nitride ($SiO_xN_y$) or silicon nitride, and is formed by CVD. The purpose of the seed layer is to allow a porous dielectric layer to be formed on it due to its selective seed compounds as to described layer in detail.

Figure 2C:
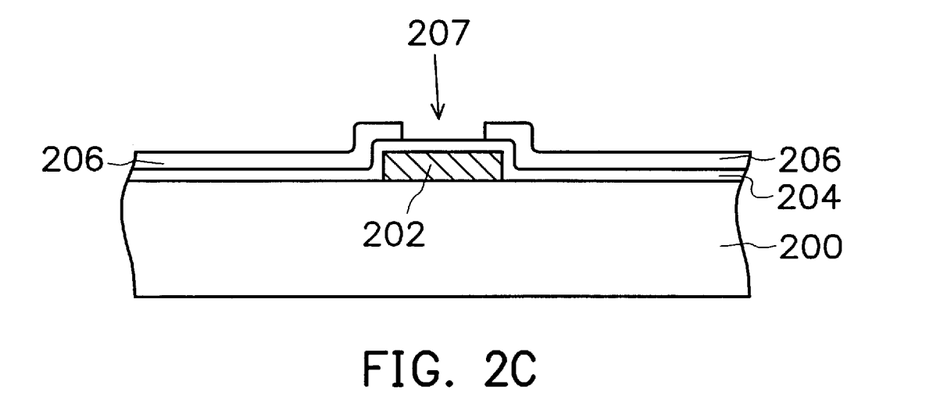

In FIG. 2C, the seed layer 206 is patterned by, for example, photolithography and etching to form an opening 207, which exposes the liner oxide layer 204 at a portion above the patterned metal layer 202.

Figure 2D:
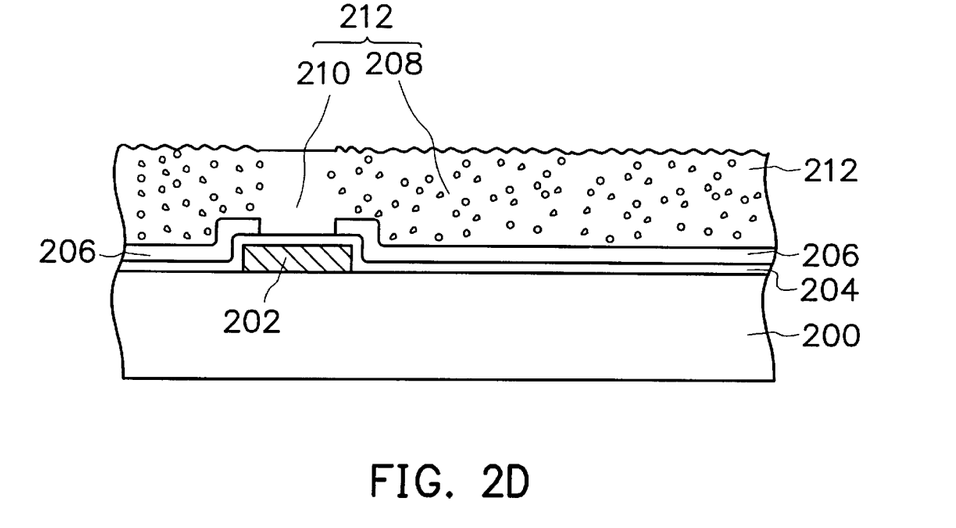

In FIG. 2D, a dielectric layer 212 including, for example, silicon oxide is formed over the substrate 200. Due to the seed layer 206, the dielectric layer 212 includes a porous dielectric layer 208 on the seed layer 206, and a normal dielectric layer 210 on the exposed portion of the liner oxide layer 204 above the patterned metal layer 202. The formation of the dielectric layer 212 includes, for example, performing a CVD process at a temperature of about 350° C.–800° C., and a pressure of about 76 mmHg–760 mmHg. A reaction gas used in the CVD process includes, for example, tetra-ethyl-ortho-silicate (TEOS), He, $O_2$, $O_3$, or $N_2$.

When the dielectric layer 212 is deposited, the seed layer 206 and a portion of the liner oxide layer 204 are exposed at current state. The dielectric layer 212 on the exposed portion of the liner oxide layer 204 is formed as the normal dielectric layer 210. The dielectric layer 212 also includes a porous dielectric layer 208 abutting the normal dielectric layer 210 on the seed layer 206. The seed layer includes seed compounds. For example, the silicon-oxygen nitride material includes seed compounds of Si—O—SI, Si—O—N, or SI—N, all of which can cause a selective deposition mechanism during the CVD process. The dielectric layer 212 on the seed layer 206 therefore includes a large number of voids so as to form the porous dielectric layer 208. The seed layer 206 is one of the invention so that the porous dielectric layer 208 is formed. The normal silicon oxide material has a dielectric constant of about 4.0–4.9. Since the porous dielectric layer 208 includes a large number of voids, which has a dielectric constant of about 1.0006, the total dielectric constant of the porous dielectric layer 208 is naturally reduced. The porous dielectric layer 208 is the main body of the dielectric layer 212. The normal dielectric layer 210 occupies only a small portion with typical opening width dimension. More actually, a via opening is to be formed layer in the normal dielectric layer 210, the normal dielectric layer 210 contributes almost no effect to the dielectric layer 212 at the end. The details are to be described later. Moreover, it is also necessary to form the via open in the normal dielectric layer 210 by a reason to prevent a metal poisoned phenomenon occurring. If opening is directly form in the porous dielectric layer 208, voids can absorb water vapor during cleaning process. The water vapor will be released during a subsequent process with high temperature, resulting in the metal poisoned phenomenon. Moreover, if opening is directly formed in the porous dielectric layer 208, when metal material, is filled into the opening, the voids may also be filled with metal material, causing a short circuit. Since the normal dielectric layer preserves a necessary space for forming a via plug, the metal poisoned phenomenon and the short circuit do not occur.

Figure 2E:
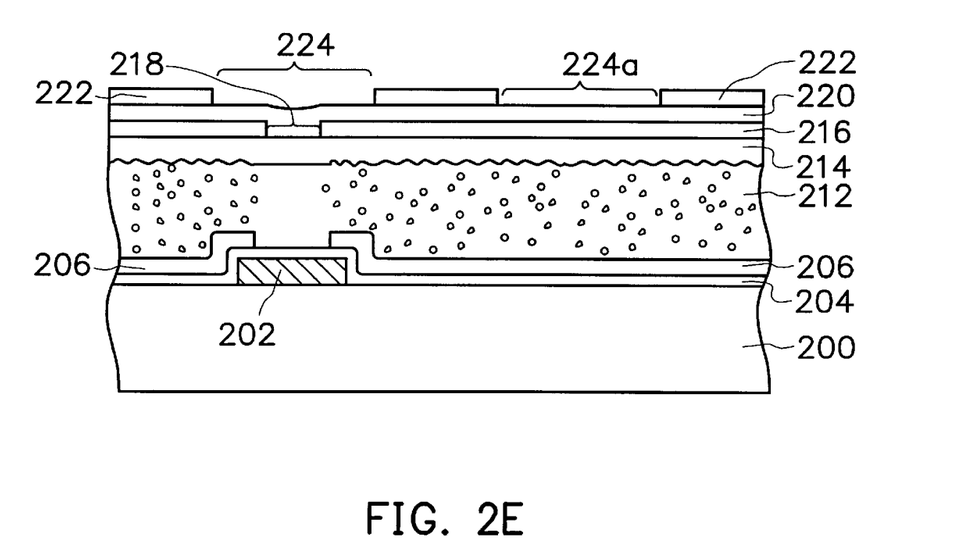

In FIG. 2E, a cap layer 214 including, for example, silicon nitride or silicon-oxygen nitride is formed over the dielectric layer 212 through, for example, CVD. A planarization process is performed to planarize the cap layer 214. The cap layer 214 can protect the porous dielectric layer 208, which has a weaker structure. In addition, since the porous dielectric layer 208 usually has no planar surface, the planarized cap layer 214 provides a planar surface for the subsequent fabrication processes. The cap layer also provides a compensation of a desired thickness of the dielectric layer 212.

An etching stop layer 216 is formed on the cap layer 214. The etching stop layer 216 is also patterned to form an opening 218 to expose the cap layer 214 at a portion above the patterned metal layer 202. The width of the opening 218 is narrower than the width of the opening 207 of FIG. 2C so that the opening 218 is located above the normal dielectric layer 210 of FIG. 2D. A conformal liner oxide layer 220 is formed over the substrate 200 so that the opening 218 is also filled. A seed layer 222 is formed on the liner oxide layer 220. Patterning the seed layer 222 forms an opening 224 and an opening 224a, both of which expose the liner oxide layer 220. The opening 224 is above the opening 218 with a greater width so that dual damascene structure can be formed. THE opening 224a is sued to form a trench metal line later or other general uses, and is not directly related to the dual damascene structure. The opening 224a is presented for an example if it is desired to be simultaneously formed with the dual damascene structure. The seed layer 222 is similar to the seed layer 206 with a same purpose so that the seed layer 222 includes, for example, silicon nitride or silicon-oxygen nitride. The formation of the seed layer 222 also includes a CVD process.

Figure 2F:
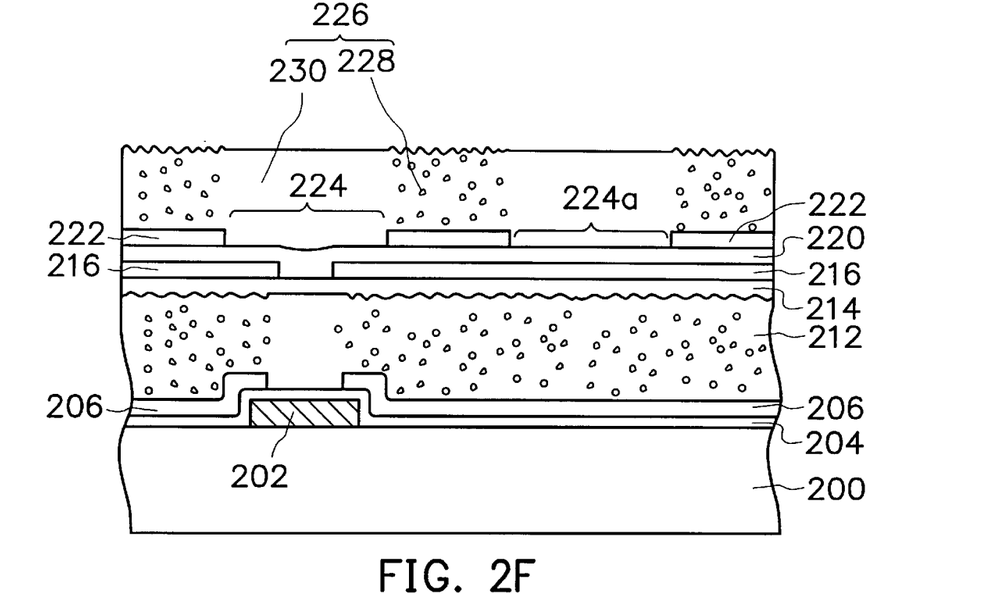

In FIG. 2F, a dielectric layer 226 similar to the dielectric layer 212 is formed over the substrate. With the same formation mechanism as that described in FIG. 2E, the dielectric layer 226 includes a porous dielectric layer 228 and a normal dielectric layer 230. The porous dielectric layer 228 is formed on the patterned seed layer 222 and the normal dielectric layer 230 is formed above the openings 224, 224a. The formation of the dielectric layer 226 includes, for example, performing a CVD process at a temperature of about 350° C.–800° C., and a pressure of about 76 mmHg–760 mmHg. A reaction gas used in the CVD process includes, for example, tetra-ethyl-ortho-silicate (TEOS), He, $O_2$, $O_3$, or $N_2$. With the same formation mechanism, the porous dielectric layer 228 including a large number of voids is formed. The dielectric constant is naturally and effectively reduced. A trench is to be formed in the normal dielectric layer 230 later. The metal poisoned phenomenon and the short circuit do not occur in the trench. The opening 224 is preferably used for the formation of a trench so that a metal line can be form in the trench. The opening 224 can also be used for a formation of a dual damascene via plug, which is one kind of the dual damascene structure.

Figure 2G:
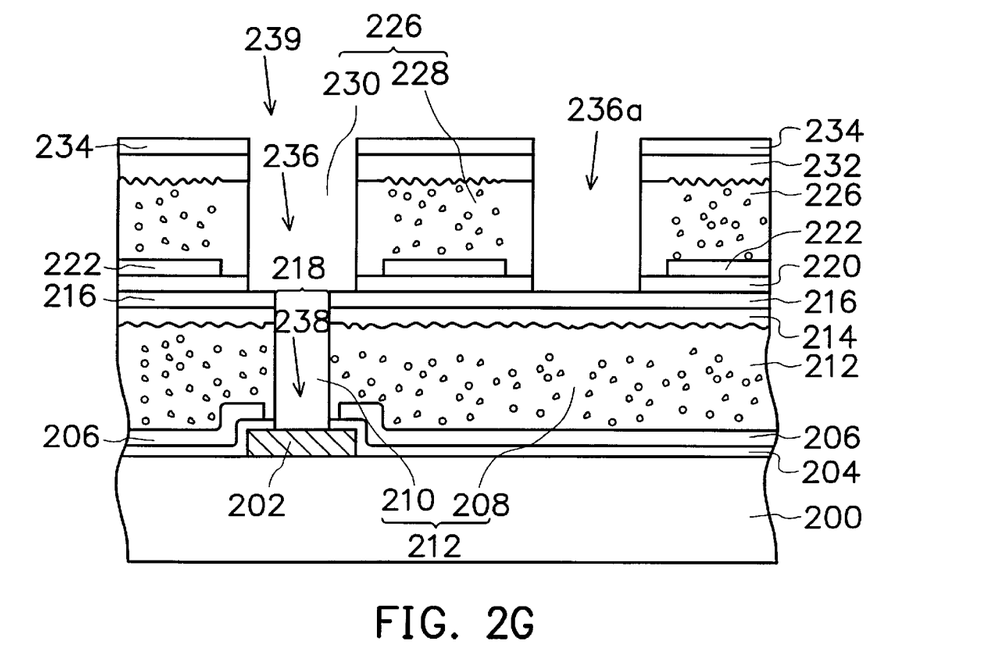

In FIG. 2G, a cap layer 232 is formed over the dielectric layer 226 with the same reason as that of the cap layer 214. A planarization process is performed to planarize the cap layer 214. The cap layer 232, as usual, can protect the porous dielectric layer 228 in the dielectric layer 226, provide a planar surface for the subsequent fabrication process, and provide a compensation of the desired thickness. A mask layer 226 including, for example, silicon oxide is formed on the cap layer 232.

A trench 236, for example, is formed by patterning the mask layer 234, the cap layer 232, the normal dielectric layer 230 of the dielectric layer 226, and the seed layer 220 so that the etching stop layer 216 is exposed. The patterning process includes, for example, photolithography and etching. Using the etching stop layer 216, which has the opening 218, as an etching mask, the etching process is continuously performed to etching the normal dielectric layer 210 of the dielectric layer 212, the liner oxide layer 204 until the patterned metal layer 202 is exposed. A via opening 238 is formed in the normal dielectric layer 210. The trench 236 and the via opening 238 form together as a dual damascene opening 239. The trench 236a is also simultaneously formed in the normal dielectric layer 230 to exposed the etching stop layer 216. The width of the trenches 236 and 236a are necessary to be respectively narrower than the openings 224 and 224a of FIG. 2F so that the trenches 236 and 236a is for sure to be formed in the normal dielectric layer 230. Similarly, as describe in FIG. 2E, the via opening 238 is formed in the normal dielectric layer 210. The metal poisoned phenomenon and the short circuit are avoided.

Figure 2H:
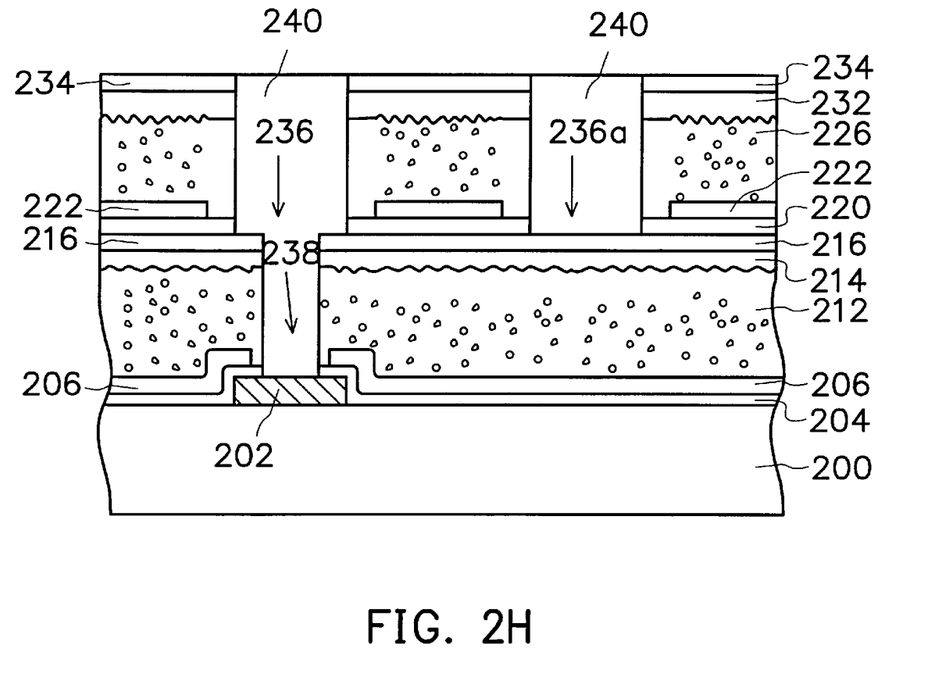

In FIG. 2G and FIG. 2H, a conductive layer, such as a metal layer, is formed over the substrate 200 to fill the dual damascene opening 239 and the trench 236a. Using the mask layer 234 as a planarization stop point, a planarization process is performed to remove the metal layer. A remaining portion of the metal layer becomes a metal layer 240, which just fill the dual damascene opening 239 and the trench 236a. A portion of the metal layer 240 filled in the via opening 238 serves as a via plug, and a portion of the metal layer 240 filled in the trenches 236, 236a serves as an interconnecting metal line.

In the method of the invention described above, the dual damascene opening typically includes the via opening 238 and the trench 236. In general, the trench 236 can be any kind of openings. For example, the trench 236 can also include an opening also so that the dual damascene structure is a dual damascene via plug. Moreover, the trench 236a is not directly related to the formation of the dual damascene opening 239 but it is helpful to form it simultaneously for other interconnecting purpose.

Moreover, in order to generally obtain the normal dielectric layers 210, 230 for the formation of the dual damascene opening 239, the liner oxide layers 204, 220 are not necessary, and the first opening 207 of FIG. 2C can, for example, fully expose the pattern metal layer 202. In this manner, the portion of the seed layer 206 above the patterned metal layer 202 can be, for example, planarized away by a planarization process. Then the dielectric layer 212 and other structures are formed as described above.

In conclusion, the invention has several characteristics as follows:

1. The invention includes a formation of the seed layer so as to form a porous dielectric layer to serves as a conventional inter-metal dielectric (IMD) layer with a smaller dielectric constant. The parasitic capacitor effect is effectively reduced so that the effect of the RC time delay is effectively reduced. The device operation speed is therefore faster.

2. The porous dielectric layer with lower dielectric constant is formed to take the place of the conventional silicon-oxide IMD layer so taht when device dimension is highly reduced, the cross-talk effect between each interconnecting metal line is effectively reduced.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating dual damascene structure on a substrate, having a patterned metal layer, the comprising:

forming a first liner oxide layer over the substrate;

forming a first seed layer over the first liner oxide layer;

patterning the first seed layer to form a first opening above the patterned metal layer to expose a portion of the first liner oxide layer;

forming a first dielectric layer over the substrate, wherein the dielectric layer includes a first normal dielectric layer formed on the exposed portion of the first liner oxide layer, and a first porous dielectric layer formed on the first seed layer;

forming a first cap layer over the first dielectric layer;

forming an etching stop layer on the first cap layer with a second opening above the first opening, wherein the second opening is narrower than the first opening;

forming a second liner oxide layer over the substrate;

forming a second seed layer on the second liner oxide layer with a third opening above the second opening to expose a portion of the second liner oxide layer, wherein the third opening is wider than the second opening of the etching stop layer;

forming a second dielectric layer over the substrate, wherein the dielectric layer includes a second normal dielectric layer formed on the exposed portion of the second liner oxide layer, and a second porous dielectric layer formed on the second seed layer;

forming a second cap layer over the second dielectric layer;

forming a mask layer on the second cap layer;

forming a dual damascene opening in the second normal dielectric layer and the first normal dielectric layer to expose the patterned metal layer, wherein the dual damascene opening comprises an upper wider opening formed in the second normal dielectric layer to expose the etching stop layer and its second opening, and a lower narrower opening formed in the first normal dielectric layer to exposed a portion of the patterned metal layer, according to a dimension of the second opening;

forming a conductive layer over the substrate; and performing a planarization process, using the mask layer as a planarization stop point, to remove the conductive layer so that a remaining portion of the conductive layer fills the dual damascene opening to form the dual damascene structure.

2. The method of claim 1, wherein the upper wider opening of the dual damascene opening comprises a trench.

3. The method of claim 1, wherein the steps of forming the first liner oxide layer and forming the second liner oxide layer comprise chemical vapor deposition (CVD).

4. The method of claim 1, wherein the first liner oxide layer and the second liner oxide layer comprises silicon oxide.

5. The method of claim 1, wherein the steps of forming the first seed layer and forming the second seed layer comprise chemical vapor deposition (CVD).

6. The method of claim 1, wherein the first seed oxide layer comprises silicon nitride or silicon oxytride.

7. The method of claim 1, wherein the second seed oxide layer comprises silicon nitride or silicon xynitride.

8. The method of claim 1, wherein the steps of forming the first dielectric layer and forming the second dielectric layer comprises a CVD process.

9. The method of claim 8, wherein the CVD process used in the steps of forming the first dielectric layer and forming the second dielectric layer comprises a reaction gas of tetra-ethyl-ortho-silicate (TEOS) and one of He, $O_2$, $O_3$, or $N_2$.

10. The method of claim 9, wherein the CVD process used in the steps of forming the first dielectric layer and forming the second dielectric layer comprises a temperature of about 350° C.–800° C. and a pressure of about 76 mmHg–760 mmHg.

11. The method of claim 1, wherein the step of forming the dual damascene opening further comprises:

performing a first stage of a patterning process on the mask layer, the second cap layer, the second normal dielectric layer, and the second liner oxide layer to form the upper wider opening in the second normal dielectric layer so as to expose the second opening and a portion of the etching stop layer around the second opening, wherein a width of the upper wider opening is between a width of the second opening and a width of the third opening of the second seed layer; and continuously performing a second stage of the patterning process on a remaining portion of the second liner oxide layer filled in the second opening the first cap layer, the first normal dielectric layer, and the first liner oxide layer so as to form the lower narrower opening to expose the patterned metal layer, wherein the etching stop layer with its second opening automatically serves as an addition mask layer.

12. A method for fabricating a dual damascene structure on a substrate having a patterned metal layer, the comprising:

forming a first seek layer on the substrate but not on the patterned metal layer;

forming a first dielectric layer over the substrate, wherein the dielectric layer includes a first normal dielectric layer formed on the patterned metal layer, and a first porous dielectric layer formed on the first seed layer;

forming a first cap layer over the first dielectric layer;

forming an etching stop layer on the first cap layer with a first opening to expose the patterned metal layer;

forming a second seed layer on the etching stop layer with a second opening to expose the first opening and a portion of the etching stop layer around the first opening;

forming a second dielectric layer over the substrate, wherein the dielectric layer includes a second normal dielectric layer formed within a region of the second opening, and a second porous dielectric layer formed on the second seed layer;

forming a second cap layer over the second dielectric layer;

forming a mask layer on the second cap layer;

forming a dual damascene opening in the second normal dielectric layer and the first normal dielectric layer to expose the patterned metal layer, wherein the dual damascene opening comprises an upper wider opening formed in the second normal dielectric layer to expose the etching stop layer and its first opening, and a lower narrower opening formed in the first normal dielectric layer to exposed a portion of the patterned metal layer, according to a dimension of the second opening;

forming a conductive layer over the substrate; and performing a planarization process, using the mask layer as a planarization stop point, to remove the conductive layer so that a remaining portion of the conductive layer fills the dual damascene opening to form the dual damascene structure.

13. The method of claim 12, wherein the upper wider opening of the dual damascene opening comprises a trench.

14. The method of claim 12, wherein the steps of forming the first seed layer and forming the second seed layer comprises chemical vapor deposition (CVD).

15. The method of claim 12, wherein the first seed oxide layer comprises silicon nitride or silicon oxynitride.

16. The method of claim 12, wherein the second seed oxide layer comprises silicon nitride or silicon oxynitride.

17. The method of claim 12, wherein the steps of forming the first dielectric layer and forming the second dielectric layer comprise a CVD process.

18. The method of claim 17, wherein the CVD process used in the steps of forming the first dielectric layer and forming the second dielectric layer comprises a reaction gas of tetra-ethyl-ortho-silicate (TEOS) and one of He, $O_2$, $O_3$, or $N_2$.

19. The method of claim 17, wherein the CVD process used in the steps of forming the first dielectric layer and forming the second dielectric layer comprises a temperature of about 350° C.–800° C. and a pressure of about 76 mmHg–760 mmHg.

20. The method of claim 12, wherein the step of forming the dual damascene opening further comprises:

performing a first stage of a patterning process on the mask layer, the second cap layer, and the second normal dielectric layer to form the upper wider opening in the second normal dielectric layer so as to expose the first opening and a portion of the etching stop layer around the first opening, wherein a width of the upper wider opening is between a width of the first opening and a width of the second opening of the second seed layer; and continuously performing a second state of the patterning process on a remaining portion of the second normal dielectric layer filled in the first opening, the first cap layer, and the first dielectric layer so as to form the lower narrower opening to expose the patterned metal layer, wherein the etching stop layer with its first opening automatically serves as an additional mask layer.

* * * * *